(12) United States Patent
Nakao et al.

(10) Patent No.: US 7,659,873 B2
(45) Date of Patent: Feb. 9, 2010

(54) CURRENT CONTROL CIRCUIT, LED CURRENT CONTROL APPARATUS, AND LIGHT EMITTING APPARATUS

(75) Inventors: Shigeharu Nakao, Kyoto (JP); Kei Nagao, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 231 days.

(21) Appl. No.: 11/916,492

(22) PCT Filed: Jun. 23, 2006

(86) PCT No.: PCT/JP2006/312597
§ 371 (c)(1),
(2), (4) Date: Dec. 4, 2007

(87) PCT Pub. No.: WO2007/000943
PCT Pub. Date: Jan. 4, 2007

(65) Prior Publication Data
US 2009/0115347 A1 May 7, 2009

(30) Foreign Application Priority Data
Jun. 28, 2005 (JP) ............................. 2005-188325

(51) Int. Cl.
*G09G 3/32* (2006.01)
*H05B 41/16* (2006.01)
(52) U.S. Cl. .................. 345/82; 345/211; 345/212; 345/213; 345/204; 315/247; 315/291; 315/185 S; 315/312
(58) Field of Classification Search .............. 315/247, 315/246, 224, 225, 209 R, 291, 307–326, 315/185 S, 200 A; 345/204, 690, 211–215, 345/55, 82–84, 87, 88, 90–92, 98–103

See application file for complete search history.

(56) References Cited

U.S. PATENT DOCUMENTS

| 3,836,887 | A | * | 9/1974 | Ueda et al. ............. 340/825.57 |
| 4,198,623 | A | * | 4/1980 | Misek et al. ................ 345/175 |
| 4,246,611 | A | * | 1/1981 | Davies ........................ 348/734 |
| 5,426,446 | A | * | 6/1995 | Takei et al. ................... 345/82 |
| 2009/0174338 | A1 | * | 7/2009 | Muramatsu ................. 315/250 |

FOREIGN PATENT DOCUMENTS

| JP | 53-80271 | 7/1978 |
| JP | 01-141412 | 6/1989 |
| JP | 2001-272938 | 10/2001 |
| JP | 2002-111786 | 4/2002 |
| JP | 2004-205669 | 7/2004 |
| JP | 2005-093566 | 4/2005 |

\* cited by examiner

*Primary Examiner*—Tuyet Vo
(74) *Attorney, Agent, or Firm*—Fish & Richardson P.C.

(57) ABSTRACT

A counter circuit increments a count value bit by bit in synchronization with a clock pulse received from an oscillating portion. A lower order decoder receives the count value output from the counter circuit, compares a bit or bits on a lower side with a set value 1, and outputs an H-level only in a time period when the bit or bits match a bit pattern of set value 1. Similarly, an upper order decoder compares a bit or bits on an upper side with a set value 2, and outputs an H-level only in a time period when the bit or bits match the bit pattern of set value 2. An AND circuit renders a transistor conductive in a time period when both lower and upper order decoders are outputting signals of the H-level.

10 Claims, 7 Drawing Sheets

FIG.2
COUNT VALUE
(a) 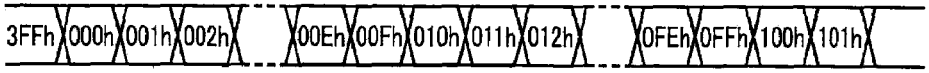
LOWER BITS
(b) 
UPPER BITS
(c) 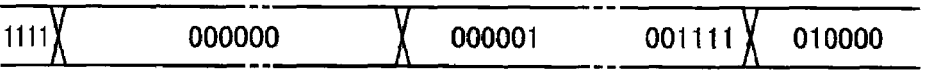
LOWER ORDER DECODER
(d) 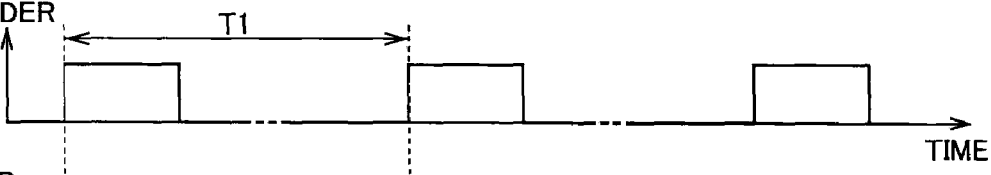
UPPER ORDER DECODER
(e) 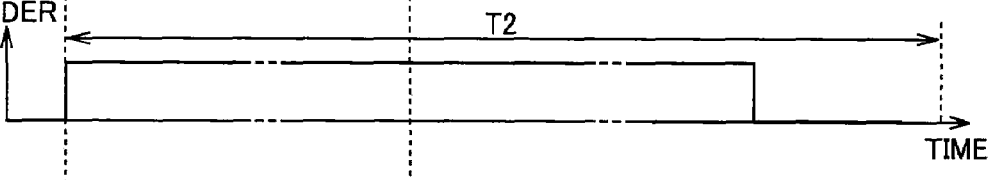
AND CIRCUIT
(f) 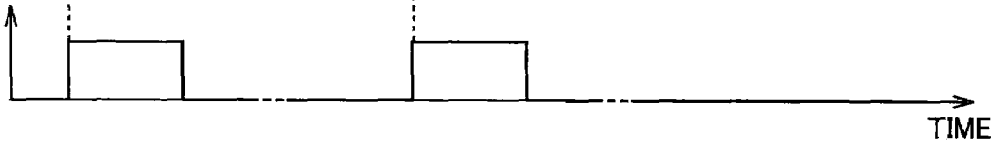

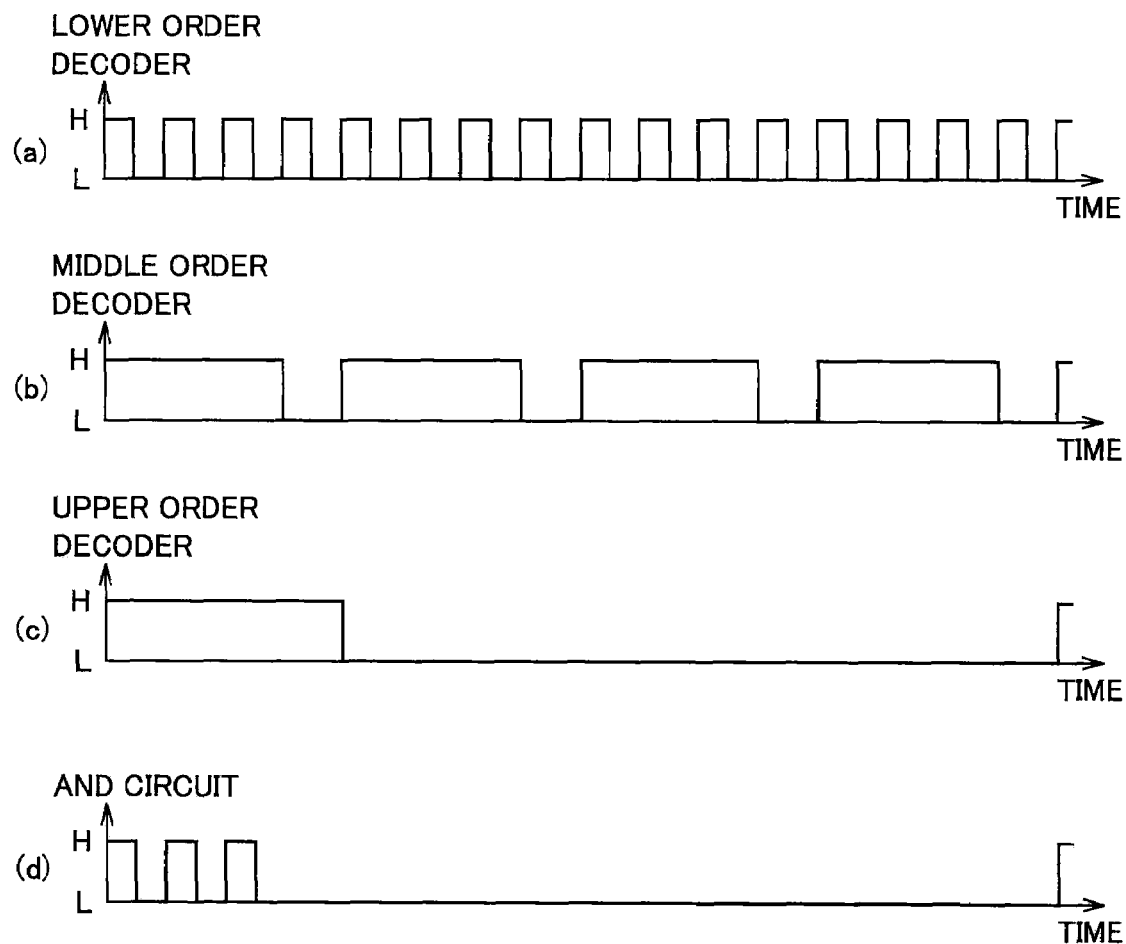

CURRENT CONTROL CIRCUIT, LED CURRENT CONTROL APPARATUS, AND LIGHT EMITTING APPARATUS

TECHNICAL FIELD

The present invention relates to a current control circuit, an LED current control apparatus and a light emitting apparatus in which a current value to be supplied is adjusted by switching and, more specifically, to a current control circuit, an LED current control apparatus and a light emitting apparatus in which a current value corresponding to a product of a plurality of set values is supplied.

BACKGROUND ART

In electronic devices such as a portable telephone, various LEDs (Lighting Emitting Diode) are used as backlights of a liquid crystal display (LCD) or as user interfaces. In addition to simple lighting of LEDs, light emitting intensity or state of flickering of LEDs may be changed dependent on the state of the device or by user setting. Generally, such visual effects are realized by arranging three types of LEDs, that is, "red", "green" and "blue", and by adjusting respective light emitting intensities.

The light emitting intensity of an LED changes dependent on the amount of supplied current and, therefore, in order to represent an intended color, a current control circuit controlling a value of current to be supplied to each LED becomes necessary. In this regard, Japanese Patent Laying-Open No. 2002-111786 (Patent Document 1), for example, discloses a light emitting device in which the value of current to be supplied is controlled by pulse width modulation (PWM, in the following, also simply denoted as PWM method).

In the PWM method, a pulse signal having H (High) and L (Low) levels appear at every prescribed period, and a current is supplied to a load only in the time period when the pulse signal is at the H-level. Therefore, the longer the H-level time period, the larger the supplied current becomes. In the PWM method, the ratio of H-level time period in one period, that is, the duty ratio, is changed to control the value of current to be supplied.

Further, in order to exhibit higher visual effects, proposals have been made to change the light emitting intensity or the overall tone in accordance with user settings or signals from a sensor or sensors. By way of example, Japanese Patent Laying-Open No. 2004-205669 (Patent Document 2) discloses an LED control circuit in which light emitting intensity is changed in accordance with a sound pressure level of the voice.

Patent Document 1: Japanese Patent Laying-Open No. 2002-111786
Patent Document 2: Japanese Patent Laying-Open No. 2004-205669

DISCLOSURE OF THE INVENTION

Problems to be Solved by the Invention

Setting of brightness of a liquid crystal display screen of a portable telephone, for example, can generally be changed by a user. When an arrangement that changes light emitting intensity in accordance with a signal from a sensor is added to such a portable telephone, it becomes necessary to supply currents in accordance with the value set by the user and the value set by the sensor signal. Namely, it is necessary to determine the duty ratio by multiplying the two set values.

Further, if an arrangement in which the light emitting intensity is changed in accordance with signals from a plurality of sensors is adopted, it becomes necessary to determine the duty ratio by multiplying all the set values corresponding to respective sensor signals.

In electronic devices such as portable telephones, from the viewpoints of simpler circuit configuration and lower power consumption, each set value is applied as a digital value, that is, as a bit string. Therefore, multiplication of a plurality of set values requires a multiplier that can handle at least the total sum of bit numbers forming each set value. For example, in order to multiply set values of 64 stages (6 bits) by each other, a multiplier of 12 bits is necessary.

Therefore, when the duty ratio is determined by multiplying a number of set values, the multiplier and the storage area come to be implemented with multi-bits, and the circuit configuration becomes complicated.

The present invention was made to solve these problems and its object is to provide a current control circuit, an LED current control apparatus and a light emitting apparatus supplying a current value in accordance with a product of a plurality of set values, by a simplified circuit structure.

Means for Solving the Problems

According to an aspect, the present invention provides a current control circuit receiving a plurality of set values externally and supplying a current value in accordance with a product of the plurality of set values. The current control circuit in accordance with the present invention includes a counter circuit incrementing or decrementing a count value in accordance with a clock signal; a plurality of decoder circuits corresponding to the plurality of set values respectively; a combining portion outputting a drive command by combining a plurality of supply commands output from the plurality of decoder circuits; and a driving portion adjusting a current value by driving a current to be supplied intermittently in accordance with the drive command received from the combining portion; wherein each of the plurality of decoder circuits receives its corresponding set value and the count value, and outputs a supply command in a time period when the count value assumes a value corresponding to the set value; and the combining portion receives the supply commands from respective ones of the plurality of decoder circuits, and outputs the drive command in a time period when the supply commands are applied from all of the plurality of decoder circuits.

Preferably, the current control circuit further supplies a current to each of a plurality of loads, receiving a plurality of set values provided for respective loads and supplies a current value to each load in accordance with a product of set values provided for the loads, and further includes a plurality of combining portions and a plurality of driving portions provided corresponding to the plurality of loads, respectively. Each of the plurality of driving portions adjusts the current value by driving the current to be supplied to its corresponding load intermittently, and each of the plurality of combining portions generates a drive command by combining a supply command output by receiving of a set value directed to its corresponding load among the supply commands output from the plurality of decoder circuits, and outputs the drive command to its corresponding driving portion.

Preferably, the plurality of set values include set values directed to two or more loads, and the plurality of decoder circuits include a decoder circuit receiving set values directed to the two or more loads and outputting one same supply command to two or more combining portions corresponding to the loads.

Preferably, the supply command is a pulse signal repeatedly assuming a high level and a low level, and the combining portion generates the drive command by receiving and obtaining a logical product of a plurality of pulse signals.

Preferably, each of the plurality of decoder circuits uses necessary number of bits among a plurality of bits forming the count value, in accordance with the number of stages of the set value it receives.

According to another aspect, the present invention provides an LED current control apparatus, including: a power source; an LED connected to the power source; and a current control circuit connected in series with the power source and the LED, receiving a plurality of set values externally and supplying a current value in accordance with a product of the plurality of set values. The current control circuit includes a counter circuit incrementing or decrementing a count value in accordance with a clock signal, a plurality of decoder circuits receiving any one of the plurality of set values and the count value, and applying a supply command in a time period when a value represented by mutually different one or two or more bits among a plurality of bits forming the count value assumes a value corresponding to the set value, a combining portion receiving a plurality of supply commands from the plurality of decoder circuits and outputting a drive command in a time period when the supply commands are applied from all of the plurality of decoder circuits, and a driving portion adjusting a current value by driving a current to be supplied intermittently, in accordance with the drive command received from the combining portion.

According to a still further aspect, the present invention provides a current control circuit, having a driving transistor connected in series with a load circuit between a power supply voltage and a reference voltage, and a drive control circuit controlling conduction of the driving transistor, for controlling current flowing through the load circuit by adjusting conduction time of the driving transistor. The drive control circuit has a plurality of pulse generating circuits outputting a first pulse signal of a first duty ratio and a second pulse signal of a second duty ratio at a period different from the first pulse, formed from one clock signal, and drives the driving transistor in accordance with a pulse signal obtained by logical multiplication of the first and second pulse signals.

Preferably, duty ratios of the first and second pulse signals can be set based on mutually different command signals respectively.

Preferably, the plurality of pulse generating circuits have one counter circuit counting the clock signal, a first decoder circuit performing comparison with a first command signal, using a plurality of first bit outputs generated by the counter circuit, and a second decoder circuit performing comparison with a second command signal, using a plurality of second bit outputs different from the plurality of first bit outputs used in the first decoder circuit.

According to a still further aspect, the present invention provides a light emitting apparatus including a load circuit and the current control circuit described above. The load circuit includes a plurality of LED elements of mutually different colors, and current caused to flow through each LED element is individually controlled by using a plurality of driving transistors.

EFFECTS OF THE INVENTION

According to the present invention, each of the decoder circuits for generating supply commands in accordance with a plurality of settings generates the supply command in accordance with the count value output from the same counter circuit. Therefore, the reference generating means for generating the plurality of supply commands in accordance with respective set values can be implemented by one counter circuit. Further, the supply commands generated based on the common count value have phases that are multiples of each other. Therefore, by combining the supply commands at the combining portion, a process of combining supply commands with each other can be performed easily. Thus, the current control circuit, the LED current control apparatus and the light emitting apparatus supplying current value in accordance with a product of a plurality of set values can be realized with simplified circuit configurations.

BRIEF DESCRIPTION OF THE DRAWINGS

FIG. 2 is a time chart of various portions in accordance with Embodiment 1.

FIG. 7 is a time chart of various portions in accordance with Embodiment 3.

Figure 1:
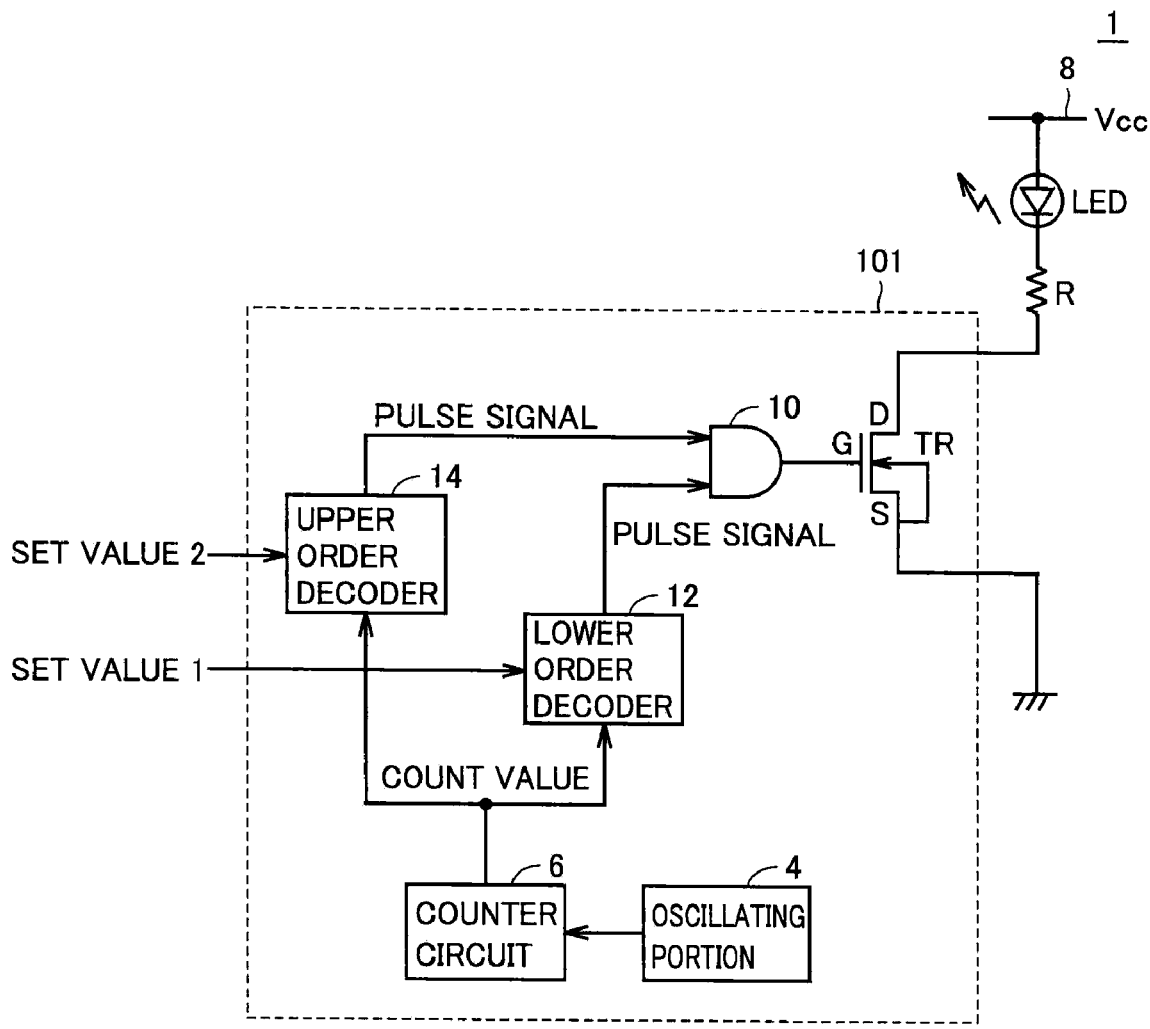
FIG. 1 shows a schematic configuration of an LED current control apparatus in accordance with Embodiment 1.

DESCRIPTION OF THE REFERENCE SIGNS 1, 2, 3 current control apparatus, 4 oscillating portion, 6 counter circuit, 8 power supply node, 10 AND circuit, 12 lower order decoder, 13 middle order decoder, 14 upper order decoder, 101, 102, 103 current control circuit, LED light emitting diode, R limiting resistor, TR, TR1, TR2, TR3 transistor.

BEST MODES FOR CARRYING OUT THE INVENTION

Embodiments of the present invention will be described in detail with reference to the figures. In the figures, the same or corresponding portions are denoted by the same reference characters and description thereof will not be repeated.

Embodiment 1

Referring to FIG. 1, an LED current control apparatus 1 in accordance with Embodiment 1 includes a current control circuit 101, a power supply node 8, a light emitting diode LED, and a limiting resistor R. Between power supply node 8 and the ground potential, light emitting diode LED, limiting resistor R and current control circuit 101 are connected in series.

Current control circuit 101 receives two mutually independent set values and drives light emitting diode LED with a current value in accordance with a product of the two set values. Current control circuit 101 includes a transistor TR, an oscillating portion 4, a counter circuit 6, a lower order decoder 12, an upper order decoder 14, and an AND circuit 10.

Transistor TR is interposed between power supply node 8 and the ground potential, renders the circuit conductive or non-conductive in response to a pulse signal applied to its gate, and adjusts the current value to be supplied to light emitting diode LED. Specifically, transistor TR functions as a driving portion. Transistor TR is, for example, implemented by an NMOS transistor.

Oscillating portion 4 generates clock pulses at a constant period, and outputs the pulses to counter circuit 6.

Counter circuit 6 is an up-counter or a down-counter, and increments or decrements the count value bit by bit in synchronization with the clock pulse received from oscillating portion 4. Counter circuit 6 has the count value consisting of bits of the number required by lower order and upper order decoders 12 and 14, and outputs the count value by the bit unit. In Embodiment 1, description will be given assuming that counter circuit 6 is an up-counter.

Lower order decoder 12 receives the count value output from counter circuit 6, compares one, two or more bits on the lower side of the count value with an externally received sets value 1, and dependent on whether the value matches the set value 1 or not, outputs a signal of H-level or L-level as a supply command.

Upper order decoder 14 receives the count value output from counter circuit 6, compares one, two or more bits on the upper side of the count value with an externally received sets value 2, and dependent on whether the value matches the set value 2 or not, outputs a signal of H-level or L-level as a supply command.

The number of bits required in the lower order and upper order decoders 12 and 14 is determined in accordance with the number of stages of the given set values. By way of example, if a set value of 64 stages is received, 6 bits are necessary, as $64=2^6$.

AND circuit 10 combines the signal output from lower order decoder 12 and the signal output from upper order decoder 14, and applies a driving command to the gate of transistor TR to control conduction or non-conduction of transistor TR. Specifically, AND circuit 10 operates a logical multiplication of signals output from lower order decoder 12 and upper order decoder 14, and outputs an H-level signal only when the signals output from lower order and upper order decoders 12 and 14 are both at the H-level.

Light emitting diode LED is, for example, an LED used as a user interface of a portable telephone, of which light emission intensity changes in accordance with the value of supplied current.

Limiting resistor R is aimed to prevent damage to the light emitting diode LED, and it restrains excessive inrush current. Provision of limiting resistor R is not always necessary, if a light emitting diode LED having high tolerance to over-current is used or if other protective function is provided.

Set values 1 and 2 are mainly given as stage values for a prescribed number of stages, and represent duty ratios in the range of 0 to 100%. Set values 1 and 2 may be given by the user through a numeric key (not shown) of the portable telephone, or given in response to a signal from an external or internal sensor (not shown). It is often the case that the signal given from the external or internal sensor is an analog signal. In that case, an analog-to-digital converter (ADC) is used to convert the signal to a digital signal, to be used as the set value.

In the following, an operation of current control circuit 101 will be described in detail. In Embodiment 1, it is assumed that set value 1 can be set in the range of 16 stages (4 bits), and set value 2 can be set in the range of 64 stages (6 bits). Therefore, counter circuit 6 outputs a count value of 10 bits.

Lower order decoder 12 determines whether lower 4 bits of the count value output from counter circuit 6 match bit pattern (s) is of set value 1 or not. Lower order decoder 12 outputs the H-level only in the time period when the bits match the bit pattern of set value 1, and outputs the L-level in other time periods.

To lower order decoder 12, set value 1 having the settable range of 16 stages is applied, and therefore, the decoder can receive 16 different patterns of binary notation "0000", "0001", . . . "1111". Therefore, when the second one (duty ratio of 12.5%) of 16 stages is to be set, for example, two patterns (for example, "0000" and "0001" in binary notation) included in 16 different patterns mentioned above are applied as set value 1 to lower order decoder 12.

Similarly, upper order decoder 14 determines whether upper 6 bits of the count value output from counter circuit 6 match bit pattern(s) of set value 2 or not. Upper order decoder 14 outputs the H-level only in the time period when the bits match the bit pattern of set value 2, and outputs the L-level in other time periods.

To upper order decoder 14, set value 2 having the settable range of 64 stages is applied, and therefore, the decoder can receive 64 different patterns of binary notation "000000", "000001", . . . "111111". Therefore, when the 16th one (duty ratio of 25%) of 64 stages is to be set, for example, 16 patterns (for example, "000000", "000001", . . . "001111" in binary notation) included in 64 different patterns mentioned above are applied as set value 2 to upper order decoder 14. Application of a plurality of patterns as set values require time and complicated processing. Therefore, a pattern in the form of "00xxxx" in binary notation ("x" may be any value: same in the following description) may be applied to upper order decoder 14.

FIG. 2 is a time chart of various portions in the example described above. For simplicity, in FIG. 2, the count value is represented in hexadecimal notation with a sign "h" added to indicate the hexadecimal notation.

FIG. 2(*a*) represents the count value output from counter circuit 6.

FIG. 2(*b*) represents lower bits of the count value output from counter circuit 6.

FIG. 2(*c*) represents upper bits of the count value output from counter circuit 6.

FIG. 2(*d*) represents a signal output from lower order decoder 12.

FIG. 2(*e*) represents a signal output from upper order decoder 14.

FIG. 2(*f*) represents a signal output from AND circuit 10.

Referring to FIG. 2(*a*), the count value output from counter circuit 6 consists of 10 bits, and count up at a prescribed period in the range of "000h", "001h", . . . "3FFh" in hexadecimal notation.

Referring to FIG. 2(*b*), the lower bit is count up at the same period as the count value output from counter circuit 6.

Referring to FIG. 2(*c*), the upper bit is count up at a 16-times longer period than the count value output from counter circuit 6.

Referring to FIG. 2(*d*), when the lower 4 bits of the count value is "0000" or "0001" such as in the case of "000h", "001h" and "010h", "011h", lower order decoder 12 outputs the H-level regardless of the upper bits. Therefore, lower order decoder 12 generates a prescribed duty ratio at a period T1.

Referring to FIG. 2(e), when the upper 6 bits of the count value is "00xxxx" as in the case of "000h", "001h", . . . "0FFh", upper order decoder 14 outputs the H-level regardless of the lower bits. Therefore, upper order decoder 14 generates a prescribed duty ratio at a period T2.

Referring to FIG. 2(f), AND circuit 10 performs a logical multiplication of the signal output from lower order decoder 12 and the signal output from upper order decoder 14, and in a time period when lower and upper order decoders 12 and 14 are both outputting H-level signals, it outputs an H-level signal.

Here, lower order and upper order decoders 12 and 14 both generate pulse signals based on the count value output from counter circuit 6. Therefore, when the time period in which count value of counter circuit 6 takes a round, that is, the time period in which the count value goes from "000h" to "3FFh" is regarded as one cycle, the pulse signals output from lower order and upper order decoders 12 and 14 match the duty ratios of set values 1 and 2, respectively. Further, the period of pulse signal output from upper order decoder 14 is a multiplication of the period of pulse signal output from lower order decoder 12, and therefore, there is no deviation in period or phase between the pulse signals. Therefore, the duty ratio of pulse signal output from AND circuit 10 matches with the product of duty ratio of set value 1 and duty ratio of set value 2.

As a result, current control circuit 101 can supply a current value in accordance with the product of set values 1 and 2 to light emitting diode LED.

In the foregoing, an example has been described in which the duty ratio of set value 1 is 12.5% and the duty ratio of set value 2 is 25%. It is noted, however, that set values 1 and 2 can be set independent from each other, and no matter to which values these are set, it is possible to apply a pulse signal having the duty ratio determined by the product of these values.

According to Embodiment 1 of the present invention, the lower order and upper order decoders output pulse signals in accordance with set values, based on the bits forming the count value output from one same counter circuit. Therefore, different from an approach in which pulse signals are generated in accordance with respective set values independent from each other, what is necessary is simply to arrange one reference generating means. Further, as the pulse signals generated based on the common count value have coinciding periods and matching phases, pulse signals can be multiplied easily with each other through an operation of logical product. Thus, a current control circuit supplying a current value in accordance with the product of a plurality of set values with a simplified circuit configuration, as well as an LED current control apparatus including such a circuit can be realized.

Further, according to Embodiment 1 of the present invention, the number of stages of set value that can be received is determined in accordance with the number of bits used in each of the decoders. Further, the number of bits used in each decoder can be selected arbitrarily and, hence, an LED current control apparatus of which design is relatively free of constraints on the number of stages of the set value can be realized.

Modification of Embodiment 1

Lower order decoder 12 and upper order decoder 14 may be configured such that the value represented by the object bits is converted to a numerical value and the numerical value is compared with the set value.

In the modification of Embodiment 1, the settable range of set value 1 is 16 stages (4 bits) and the settable range of set value 2 is 64 stages (6 bits), as in Embodiment 1. Counter circuit 6 outputs a count value of 10 bits.

Lower order decoder 12 in accordance with the modification of Embodiment 1 extracts lower 4 bits of the count value received from counter circuit 6 as an internal count value. Lower order decoder 12 outputs the H-level in the time period when the internal count value is not larger than the set value 1, and outputs the L-level in other time periods.

Upper order decoder 14 in accordance with the modification of Embodiment 1 extracts higher 6 bits of the count value received from counter circuit 6 as an internal count value. Upper order decoder 14 outputs the H-level in the time period when the internal count value is not larger than the set value 2, and outputs the L-level in other time periods.

Figure 3:
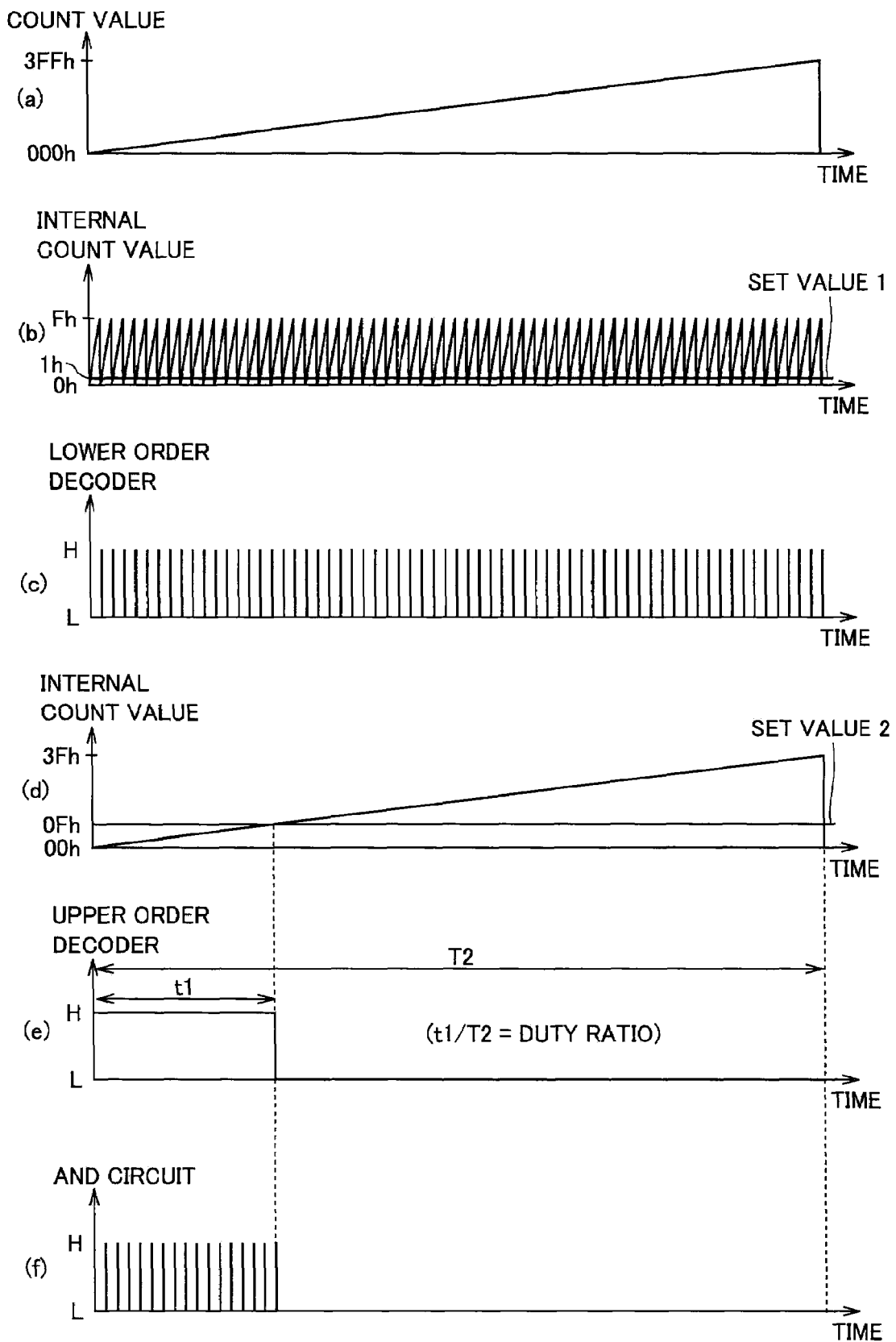
FIG. 3 is a time chart of various portions in accordance with a modification of Embodiment 1.

FIG. 3 is a time chart of various portions in accordance with the modification of Embodiment 1. In FIG. 3, for simplicity, the count value is represented in hexadecimal notation, and the sign "h" is added for indication.

FIG. 3(a) represents the count value output from counter circuit 6.

FIG. 3(b) represents the internal count value of lower order decoder 12.

FIG. 3(c) represents a signal output from lower order decoder 12.

FIG. 3(d) represents the internal count value of upper order decoder 14.

FIG. 3(e) represents a signal output from upper order decoder 14.

FIG. 3(f) represents a signal output from AND circuit 10.

Referring to FIG. 3(a), counter circuit 6 increments the count value one by one at a prescribed period, in accordance with the clock pulse received from oscillating portion 4. Counter circuit 6 counts up in the order of "000h", "001h", . . . "3FFh" repeatedly at the prescribed period. As counter circuit 6 consists of 10 bits, the period is $2^{10}$ (1024) times the period of oscillating portion 4.

Referring to FIG. 3(b), lower order decoder 12 extracts lower 4 bits of the count value output from counter circuit 6, and therefore, lower order decoder 12 counts up repeatedly in the order of "0h", "1h", . . . , "Fh", at a prescribed period.

Assume, for example, that the second one of 16 stages (duty ratio 12.5%) is to be set. In that case, "1h" is given as the set value 1. Then, lower order decoder 12 compares set value 1 with the internal count value, and outputs the H-level only in the time period when the internal count value is not higher than set value 1.

Referring to FIG. 3(c), based on the result of comparison shown in FIG. 3(b), lower order decoder 12 outputs a pulse signal having the duty ratio of 12.5%. The period of pulse signal output from lower order decoder 12 coincides the period of internal count value.

Referring to FIG. 3(d), upper order decoder 14 extracts upper 6 bits of the count value output from counter circuit 6, and therefore, upper order decoder 14 counts up repeatedly in the order of "00h", "01h", . . . "3Fh", at a prescribed period.

Assume, for example, that the 16th one of 64 stages (duty ratio 25%) is to be set. In that case, "0Fh" is given as the set value 2. Then, upper order decoder 14 compares set value 2 with the internal count value, and outputs the H-level only in the time period when the internal count value is not higher than set value 2.

Referring to FIG. 3(*e*), based on the result of comparison shown in FIG. 3(*d*), upper order decoder 14 outputs a pulse signal having the duty ratio of 25%. The period of pulse signal output from upper order decoder 14 coincides the period of count value output from counter circuit 6.

Referring to FIG. 3(*f*), AND circuit 10 performs a logical multiplication of the signal output from lower order decoder 12 and the signal output from upper order decoder 14, and outputs an H-level signal in the time period when lower order and upper order decoders 12 and 14 are both outputting H-level signals.

By the operation described above, in one cycle, that is, in the time period when the count value changes from "000h" to "3FFh", AND circuit 10 applies the pulse signal having the duty ratio determined by the logical product of duty ratio set by set value 1 and duty ratio set by set value 2, to the gate of transistor TR.

In the foregoing, an example has been described in which the duty ratio of set value 1 is 12.5% and the duty ratio of set value 2 is 25%. Set values 1 and 2 may be set independently, and no matter to which values these are set, it is possible to apply a pulse signal having the duty ratio determined by the product of these values to the gate of transistor TR.

In the foregoing, an example has been described in which lower order and upper order decoders 12 and 14 output H-level signals in the time period when internal count value is not higher than set value 1 and set value 2, respectively. The configuration is not limiting, and a configuration may be used in which the H-level signal is output when the count value is larger than the set value 1 or set value 2.

Embodiment 2

In Embodiment 1 above, an example in which two settings are given for one LED has been described. In Embodiment 2, an example in which a common setting and individual settings are given to a plurality of LEDs will be described.

Figure 4:
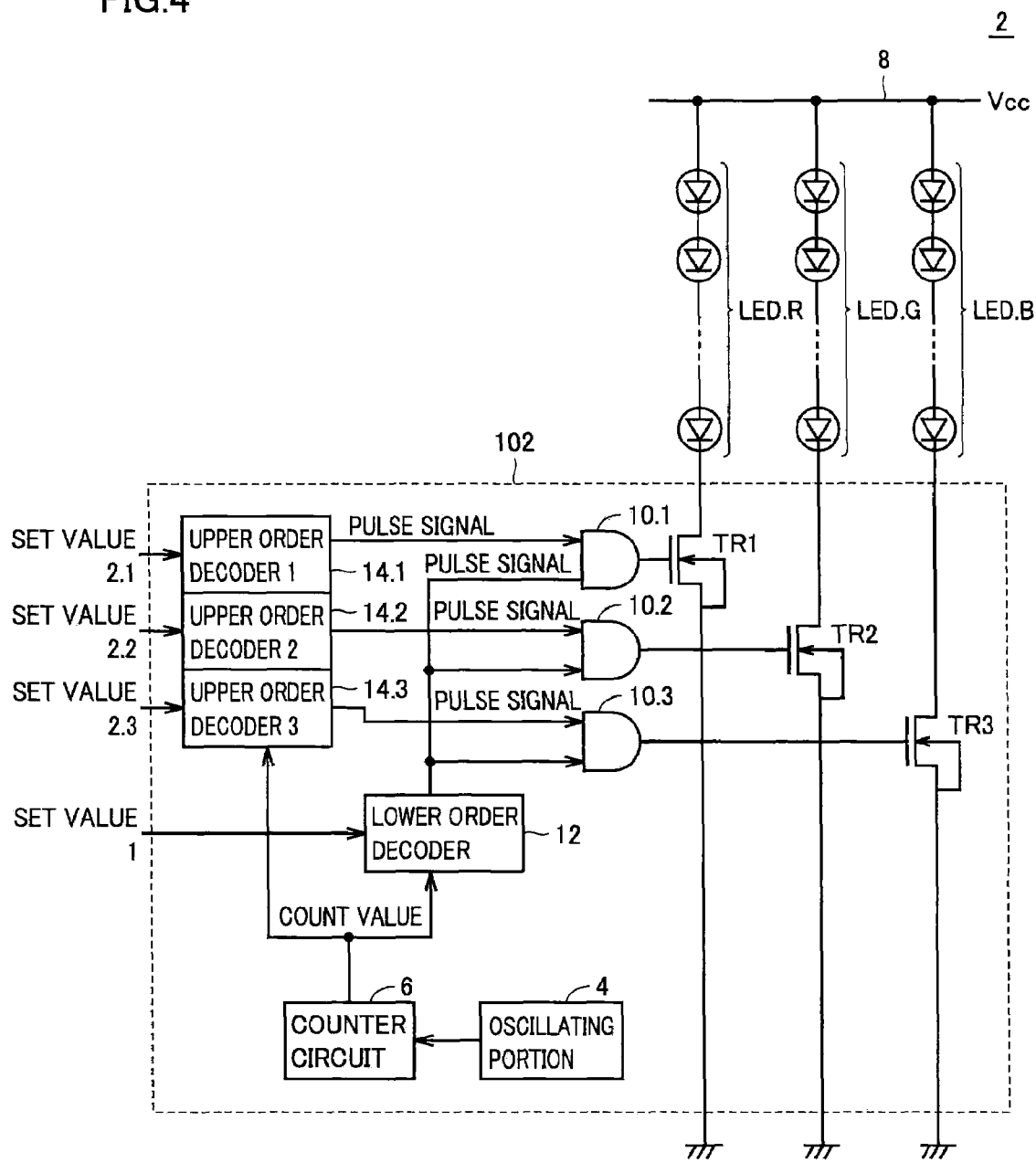
FIG. 4 shows a schematic configuration of an LED current control apparatus in accordance with Embodiment 2.

Referring to FIG. 4, an LED current control apparatus 2 in accordance with Embodiment 2 includes a current control circuit 102, a power supply node 8, and light emitting diodes LED.R, LED.G and LED.B. Between power supply node 8 and the ground potential, light emitting diodes LED.R, LED.G and LED.B are connected, respectively, and driven by current control circuit 102.

Light emitting diodes LED.R, LED.G and LED.B are formed by connecting a plurality of "red", "green" and "blue" LEDs, respectively, and they are used, for example, for a backlight of an LED display screen. By adjusting light emission intensity of each of light emitting diodes LED.R, LED.G and LED.B, various color tones can be represented.

Current control circuit 102 receives set value 1 as a common setting for light emitting diodes LED.R, LED.G and LED.B, as well as set values 2.1, 2.2 and 2.3 that are individual settings respectively, and drives the light emitting diodes LED.R, LED.G and LED.B with current values in accordance with the set values. Current control circuit 102 includes transistors TR1, TR2, TR3, oscillating portion 4, counter circuit 6, lower order decoder 12, upper order decoders 14.1, 14.2 and 14.3, and AND circuits 10.1, 10.2 and 10.3.

Transistors TR1, TR2 and TR3 are inserted between power supply node 8 and the ground potential, render conductive or non-conductive the circuit in response to the pulse signal applied to their gates, and adjust current values to be supplied to light emitting diodes LED.R, LED.G and LED.B, respectively.

Lower order decoder 12 receives the count value output from counter circuit 6, compares one or two or more bits on the lower side of the count value with the externally received set value 1, and outputs a signal of H-level or L-level dependent on whether the bit or bits match the set value 1 or not.

Upper order decoders 14.1, 14.2 and 14.3 receive the count value output from counter circuit 6 and compare one or two or more bits on the upper side of the count value with externally received set values 2.1, 2.2 and 2.3, respectively, and output signals of H-level or L-level dependent on whether the bit or bits match the set values 2.1, 2.2 and 2.3.

AND circuits 10.1, 10.2 and 10.3 perform logical multiplications of the signal output from lower order decoder 12 and signals output from upper order decoders 14.1, 14.2 and 14.3, respectively, and generate signals that are at the H-level only in the time period when the signals output from lower order decoder 12 and from upper order decoders 14.1, 14.2 and 14.3 are all at the H-level. AND circuits 10.1, 10.2 and 10.3 apply the generated signals to the gates of transistors TR1, TR2 and TR3, respectively.

Oscillating portion 4 and counter circuit 6 are the same as those of Embodiment 1 and, therefore, detailed description will not be repeated.

Figure 5:
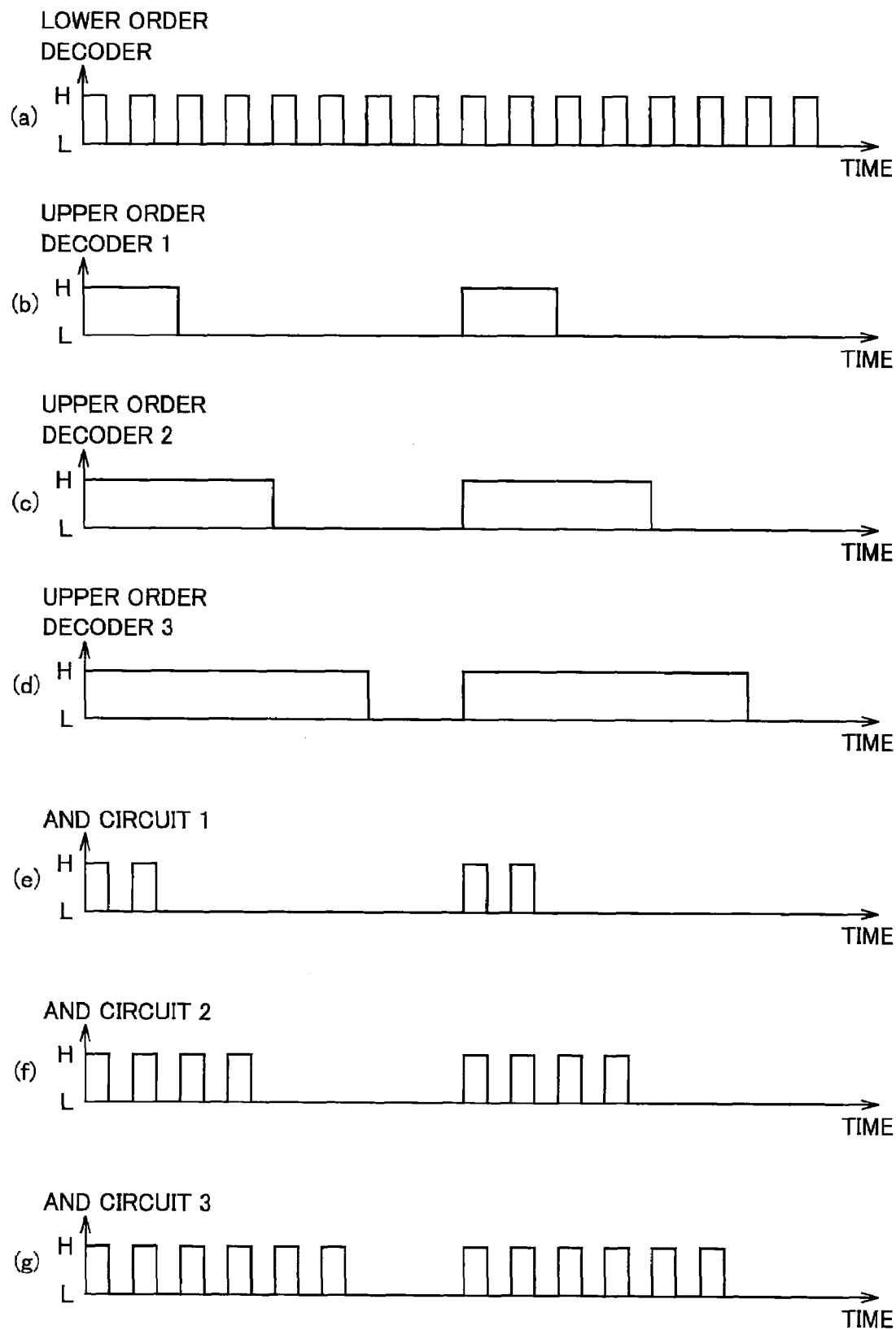
FIG. 5 is a time chart of various portions in accordance with Embodiment 2.

FIG. 5 shows a time chart of various portions in accordance with Embodiment 2. By way of example, the duty ratio of set value 1 is 50%, and duty ratios of set values 2.1, 2.2 and 2.3 are 25%, 50% and 75%, respectively.

FIG. 5(*a*) represents a signal output from lower order decoder 12.

FIGS. 5(*b*)~5(*d*) represent signals output from upper order decoders 14.1~14.3.

FIGS. 5(*e*)~5(*g*) represent signals output from AND circuits 10.1~10.3.

Referring to FIG. 5(*a*), lower order decoder 12 outputs a pulse signal that repeats H-level and L-level at a prescribed duty ratio (50%) in a constant period, in accordance with set value 1.

Referring to FIGS. 5(*b*)~5(*d*), upper order decoders 14.1, 14.2 and 14.3 output pulse signals having the duty ratios of 25%, 50% and 75%, respectively, in accordance with set values 2.1, 2.2 and 2.3. Though upper order decoders 14.1, 14.2 and 14.3 generate pulse signals independent from each other, the pulse signals are generated based on the common count value output from counter circuit 6 and, therefore, the periods are coincident with each other.

Referring to FIGS. 5(*e*)~5(*g*), AND circuits 10.1, 10.2 and 10.3 output logical products of the signal output from lower order decoder 12 and signals output from upper order decoders 14.1, 14.2 and 14.3, respectively. Therefore, AND circuits 10.1, 10.2 and 10.3 output pulse signals having duty ratios that match the products of duty ratio of set value 1 and the duty ratios of set values 2.1, 2.2 and 2.3, respectively. Specifically, the duty ratios of pulse signals output by AND circuits 10.1, 10.2 and 10.3 are 12.5%, 25% and 37.5%, respectively.

As described above, upper order decoders 14.1, 14.2 and 14.3 generate pulse signals based on the common upper bit or bits included in the count value respectively, as the generated pulse signals are used independently. Specifically, even when the pulse signals generated by a plurality of decoders are used independent from each other, it is possible to commonly apply a bit or bits included in the count value to the plurality of decoders.

According to Embodiment 2 of the present invention, in addition to the effects attained by Embodiment 1, it becomes possible to supply, to respective LEDs, current values in accordance with both the common set value and the individual set value of each of the LEDs. Therefore, when a display is given, for example, by combining a plurality of LEDs of different colors of emission, it is possible to control overall intensity using the common set value, and simultaneously to control overall color tone by using individual set values. Therefore, it is possible to meet a user setting or the like easily, without degrading the overall display effects.

Further, according to Embodiment 2 of the present invention, the lower order decoder receiving the common set value provides the output to AND circuits corresponding to respective LEDs, and therefore, it is unnecessary to provide a decoder for receiving the common set value in each of the LED circuits. Further, the upper order decoders receiving individual set values each generate a pulse signal using the same bit or bits forming the count value. Therefore, the number of bits of the count value output by the counter circuit can be reduced than when mutually different bits are used. Accordingly, an LED current control apparatus having more simplified circuit configuration can be realized.

Embodiment 3

In Embodiment 1, an example has been described in which two set values are applied to one LED. In Embodiment 3, an example will be described in which three set values are applied to one LED.

Figure 6:
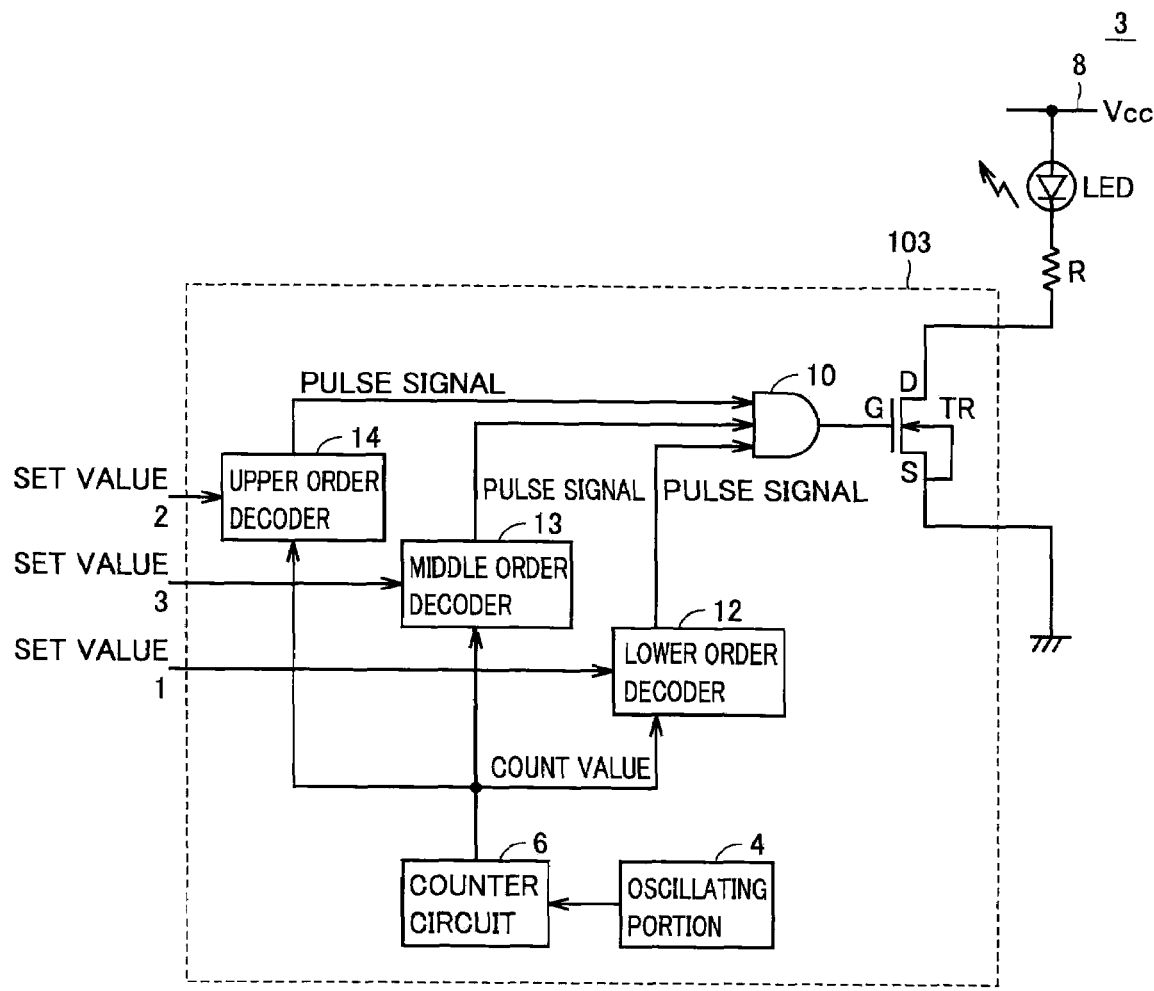
FIG. 6 shows a schematic configuration of an LED current control apparatus in accordance with Embodiment 3.

Referring to FIG. 6, an LED current control apparatus 3 in accordance with Embodiment 3 includes a current control circuit 103, power supply node 8, a light emitting diode LED, and limiting resistor R. Between power supply node 8 and the ground potential, the light emitting diode LED, limiting resistor R and current control circuit 103 are connected in series.

Current control circuit 103 corresponds to current control circuit 1 of LED current control apparatus 1 of Embodiment 1, additionally including a middle order decoder 13. Current control circuit 103 receives mutually independent three set values, and drives light emitting diode LED with a current value in accordance with the product of three set values.

Middle order decoder 13 receives the count value output from counter circuit 6, compares one or two or more bits of middle order that are not used either by lower order decoder 12 or upper order decoder 14 with an externally received set value 3, and outputs a signal of the H-level or L-level dependent on whether the bit or bits match the set value 2.

AND circuit 10 receives three signals output from lower, middle and upper order decoders 12, 13 and 14, performs a logical multiplication thereof, and generates a signal that attains to the H-level only in the time period when all the signals are at the H-level.

Except for these points, the embodiment is the same as Embodiment 1 and, therefore, detailed description will not be repeated.

FIG. 7 is a time chart of various portions in accordance with Embodiment 3. By way of example, the duty ratio of set value 1 is 50%, duty ratio of set value 2 is 75%, and duty ratio of set value 3 is 25%.

FIG. 7(a) represents a signal output from lower order decoder 12.

FIG. 7(b) represents a signal output from middle order decoder 13.

FIG. 7(c) represents a signal output from upper order decoder 14.

FIG. 7(d) represents a signal output from AND circuit 10.

Referring to FIG. 7(a), lower order decoder 12 outputs a pulse signal that repeats H-level and L-level in every constant time period, in accordance with set value 1.

Referring to FIG. 7(b), middle order decoder 13 outputs a pulse signal having the duty ratio of 75%, in accordance with set value 3.

Referring to FIG. 7(c), upper order decoder 14 outputs a pulse signal having the duty ratio of 25%, in accordance with set value 2.

Referring to FIGS. 7(a)~7(c), the period of pulse signal output from middle order decoder 13 is four times the period of pulse signal output from lower order decoder 12, and the period of pulse signal output from upper order decoder 14 is twice the period of pulse signal output from middle order decoder 13.

Referring to FIG. 7(d), AND circuit 10 operates and outputs a logical product of pulse signals output respectively from lower, middle and upper order decoders 12, 13 and 14. Therefore, AND circuit 10 outputs a pulse signal having the duty ratio obtained by multiplying the duty ratios of set values 1, 2 and 3. Specifically, the duty ratio of pulse signal output from AND circuit 10 is 9.375% (=50%×75%×25%).

As described above, AND circuit 10 receives the pulse signal output from lower order decoder 12 in accordance with the duty ratio of set value 1, the pulse signal output from upper order decoder 14 in accordance with the duty ratio of set value 2, and the pulse signal output from middle order decoder 13 in accordance with the duty ratio of set value 3, and outputs a pulse signal based on the logical product of these. Therefore, AND circuit 10 applies to the gate of transistor TR a pulse signal having the duty ratio obtained by multiplying all the duty ratios of set values 1, 2 and 3.

Therefore, it is possible for current control circuit 103 to receive set values 1, 2 and 3 from the outside and to drive the light emitting diode LED with a current in accordance with a result of multiplication thereof.

Though an example in which three set values are received and the current in accordance with result of multiplication of these values is supplied has been described, the present invention is similarly applicable to an example in which four or more set values are received and a current in accordance with the result of multiplication of these values is supplied.

According to Embodiment 3 of the present invention, in addition to the effects attained by Embodiment 1, it becomes possible to supply a current value in accordance with three or more set values to the LED. Therefore, when the light emission brightness of the LED is to be adjusted by a number of set values also, an LED current control apparatus having more simplified circuit configuration can be realized.

Though current control circuits having oscillating portions have been described in Embodiments 1 to 3, the circuit may be configured to receive a clock pulse from outside.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A current control circuit to receive a plurality of set values externally and to supply a current value in accordance with a product of said plurality of set values, the current control circuit comprising:
   a counter circuit to increment or decrement a count value in accordance with a clock signal;
   a plurality of decoder circuits corresponding to said plurality of set values respectively;

a combining portion to provide a drive command by combining a plurality of supply commands output from said plurality of decoder circuits; and a driving portion to adjust a current value by driving a current to be supplied intermittently in accordance with said drive command received from said combining portion; wherein each of said plurality of decoder circuits is configured to receive its corresponding set value and said count value, and to provide a supply command in a time period when said count value assumes a value corresponding to said set value; and said combining portion is configured to receive said supply commands from respective ones of said plurality of decoder circuits, and to provide said drive command in a time period when said supply commands are applied from all of said plurality of decoder circuits.

2. The current control circuit according to claim 1 configured to supply a current to each of a plurality of loads, to receive a plurality of set values provided for respective loads and to supply a current value to each load in accordance with a product of set values provided for the loads, and further comprising a plurality of said combining portions and a plurality of said driving portions corresponding to said plurality of loads, respectively;

wherein:

each of said plurality of driving portions is configured to adjust the current value by driving the current to be supplied to its corresponding load intermittently; and each of said plurality of combining portions is configured to generate a drive command by combining a supply command output by receiving of a set value directed to its corresponding load among said supply commands output from said plurality of decoder circuits, and to output the drive command to its corresponding driving portion.

3. The current control circuit according to claim 2, wherein said plurality of set values include set values directed to two or more loads; and said plurality of decoder circuits include a decoder circuit to receive set values directed to the two or more loads and to provide one same supply command to two or more combining portions corresponding to the loads.

4. The current control circuit according to claim 1, wherein said supply command is a pulse signal alternately assuming a high level and a low level; and said combining portion is configured to generate said drive command by receiving and obtaining a logical product of a plurality of pulse signals.

5. The current control circuit according to claim 1, wherein each of said plurality of decoder circuits is configured to use a number of bits among a plurality of bits forming said count value, in accordance with a number of stages of said set value it receives.

6. An LED current control apparatus, comprising:

a power source;

an LED connected to said power source; and a current control circuit connected in series with said power source and said LED, to receive a plurality of set values externally and to supply a current value in accordance with a product of said plurality of set values; wherein said current control circuit includes a counter circuit to increment or decrement a count value in accordance with a clock signal, a plurality of decoder circuits to receive any one of said plurality of set values and said count value, and to apply a supply command in a time period when a value represented by mutually different one or two or more bits among a plurality of bits forming said count value assumes a value corresponding to said set value, a combining portion to receive a plurality of said supply commands from said plurality of decoder circuits and to provide a drive command in a time period when said supply commands are applied from all of said plurality of decoder circuits, and a driving portion to adjust a current value by driving a current to be supplied intermittently, in accordance with said drive command received from said combining portion.

7. A current control circuit, having a driving transistor connected in series with a load circuit between a power supply voltage and a reference voltage, and a drive control circuit to control conduction of said driving transistor, for controlling current flowing through said load circuit by adjusting conduction time of said driving transistor, wherein said drive control circuit has a plurality of pulse generating circuits to provide a first pulse signal of a first duty ratio and a second pulse signal of a second duty ratio at a period different from said first pulse signal, formed from one clock signal, and to drive said driving transistor in accordance with a pulse signal obtained by logical multiplication of said first and second pulse signals.

8. The current control circuit according to claim 7, wherein duty ratios of said first and second pulse signals can be set based on mutually different command signals respectively.

9. The current control circuit according to claim 8, wherein said plurality of pulse generating circuits have one counter circuit counting said clock signal, a first decoder circuit to perform comparison with a first command signal, using a plurality of first bit outputs generated by the counter circuit, and a second decoder circuit to perform comparison with a second command signal, using a plurality of second bit outputs different from said plurality of first bit outputs used in the first decoder circuit.

10. A light emitting apparatus including a load circuit and a current control circuit, wherein said current control circuit has a driving transistor connected in series with said load circuit between a power supply voltage and a reference voltage, and a drive control circuit to control conduction of said driving transistor, for controlling current flowing through said load by adjusting conduction time of said driving transistor;

said drive control circuit has a plurality of pulse generating circuits to provide a first pulse signal of a first duty ratio and a second pulse signal of a second duty ratio at a period different from said first pulse signal, formed from one clock signal, and to control said driving transistor in accordance with a pulse signal obtained by logical multiplication of said first and second pulse signals; and said load circuit includes a plurality of LED elements of mutually different colors, wherein current caused to flow through each LED element is individually controlled by using a plurality of driving transistors.

* * * * *